(12) United States Patent
Nakagawa et al.

(10) Patent No.: US 6,953,384 B2
(45) Date of Patent: Oct. 11, 2005

(54) ELECTRONIC COMPONENT CHIP FEEDER AND MANUFACTURING METHOD OF ELECTRONIC DEVICES USING ELECTRONIC COMPONENT CHIPS

(75) Inventors: Kiyoyuki Nakagawa, Takefu (JP); Kenichi Fukuda, Sabae (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 209 days.

(21) Appl. No.: 09/988,675

(22) Filed: Nov. 20, 2001

(65) Prior Publication Data

US 2002/0031983 A1 Mar. 14, 2002

Related U.S. Application Data

(62) Division of application No. 09/401,526, filed on Sep. 22, 1999.

(30) Foreign Application Priority Data

Sep. 28, 1998 (JP) ........................................... 10-273640

(51) Int. Cl.⁷ ................................................ B24B 1/00
(52) U.S. Cl. ............................................ 451/28; 134/6
(58) Field of Search .......................... 451/28, 300, 296, 451/287, 299, 41; 134/6

(56) References Cited

U.S. PATENT DOCUMENTS

| 4,437,479 | A | | 3/1984 | Bardina et al. | |
|---|---|---|---|---|---|
| 5,738,574 | A | | 4/1998 | Tolles et al. | |
| 5,827,110 | A | | 10/1998 | Yajima et al. | |
| 5,916,012 | A | | 6/1999 | Pant et al. | |
| 6,048,409 | A | | 4/2000 | Kanno et al. | |
| 6,132,289 | A | * | 10/2000 | Labunsky et al. | 451/6 |
| 6,241,583 | B1 | * | 6/2001 | White | 451/41 |
| 6,257,966 | B1 | * | 7/2001 | Ishikawa et al. | 451/67 |
| 6,270,647 | B1 | * | 8/2001 | Graham et al. | 205/99 |
| 6,283,822 | B1 | * | 9/2001 | Togawa et al. | 451/5 |
| 6,325,706 | B1 | * | 12/2001 | Krusell et al. | 451/296 |
| 6,334,903 | B1 | * | 1/2002 | Harju | 134/6 |
| 6,336,843 | B2 | * | 1/2002 | Nakagawa et al. | 451/28 |
| 6,343,975 | B1 | * | 2/2002 | Mok | 451/41 |

FOREIGN PATENT DOCUMENTS

| JP | 5-37186 | 2/1993 |
|---|---|---|
| JP | 66224592 | 8/1994 |
| JP | 8-48419 | 2/1996 |
| JP | 8-107297 | 4/1996 |
| JP | 8107297 | 4/1996 |
| JP | 9-23095 | 1/1997 |

* cited by examiner

*Primary Examiner*—Lee D. Wilson
(74) *Attorney, Agent, or Firm*—Burns, Doane, Swecker & Mathis LLP (57) ABSTRACT

An electronic component chip feeder enabling to feed electronic component chips in which electrodes on the outer surfaces thereof can be cleanly maintained and the reliability of electrical connections is excellent even when miniaturizing thereof is promoted, and a method for manufacturing electronic devices by using electronic component chips being excellent in the reliability of electrical connections are provided. The electronic component chip feeder for feeding electronic component chips includes a cleaning device disposed in an intermediate portion of a supplying system for supplying plural electronic component chips in an aligned relationship for cleaning outer surfaces of the electronic component chips.

10 Claims, 5 Drawing Sheets

ELECTRONIC COMPONENT CHIP FEEDER AND MANUFACTURING METHOD OF ELECTRONIC DEVICES USING ELECTRONIC COMPONENT CHIPS

This application is a continuation divisional of application Ser. No. 09/401,526, filed on Sep. 22, 1999.

BACKGROUND OF THE INVENTION

1. Field of the Invention

The present invention relates to an electronic component chip feeder for feeding electronic component chips to a case substrate or a printed circuit board to be placed with electronic components, and more specifically, it relates to an electronic component chip feeder equipped with a system for cleaning the surfaces of electrodes formed on the outer surfaces of electronic component chips.

The present invention also relates to a manufacturing method of electronic devices by feeding electronic component chips to a case substrate or by feeding electronic components as finished products to a printed board, etc., and more specifically, it relates to a manufacturing method of electronic devices including a cleaning step of the outer surfaces of electronic components in manufacturing steps thereof.

In addition, in this specification, the term "electronic component chip" signifies not only a part or a component of an electronic component as a finished product but also an electronic component as a finished product. In the present invention, the term "electronic device" also signifies not only the one generally called "electronic component" but also a combination of such electronic components having a specified function.

2. Description of the Related Art

Hitherto, an electronic component chip feeder has been used for mounting electronic component chips on a printed circuit board or for mounting elements forming electronic component chips on a case substrate.

Figure 7:
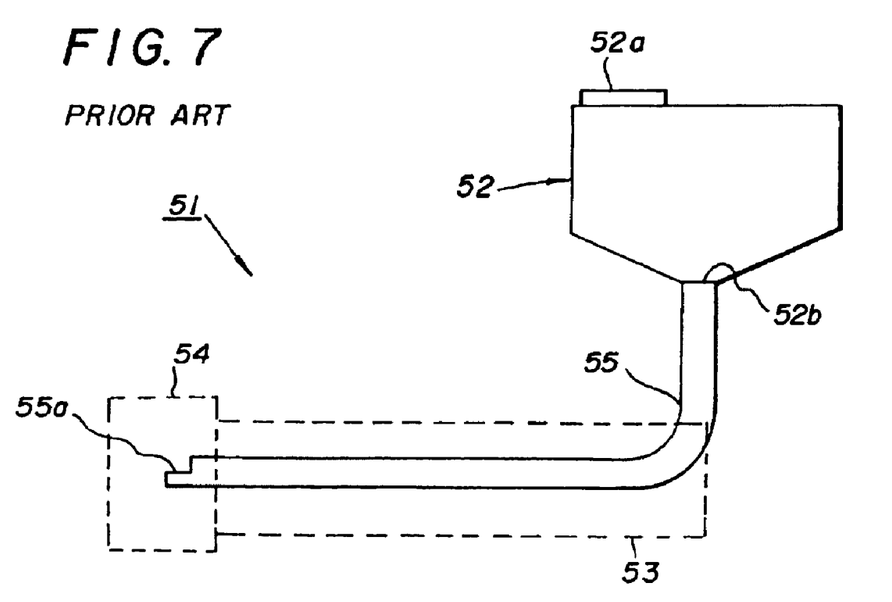
FIG. 7 is a schematic block diagram for illustrating a conventional electronic component chip feeder.

Referring to FIG. 7, a conventional electronic component feeder will be generally described.

An electronic component feeder 51 comprises a hopper 52, a buffer portion 53, and a chute portion 54. The hopper 52 has a volume capable of accommodating numerous electronic component chips with a supplying inlet 52a for electronic component chips formed in the upper portion thereof. In the bottom end of the hopper 52, a discharge outlet 52b for discharging electronic component chips one by one is formed. A large number of electronic component chips supplied through the supplying inlet 52a at random is stored in the hopper 52. The hopper 52 is formed to be vibrated by connecting a vibrating source (not shown) thereto to thereby vibrate the hopper 52 so that electronic component chips are discharged one at a time from the discharge outlet 52b.

On the other hand, a pipe 55 is connected to the discharge outlet 52b. The pipe 55 extends from the discharge outlet 52b of the hopper 52 toward the chute portion 54 side. The cross-section of the pipe 55 is to be in a shape suitable for transferring the one electronic component chip.

A sucking device (not shown) is connected to the topside of the pipe 55 to thereby transfer electronic component chips toward the top of the pipe 55 by sucking. The pipe 55 is formed of the buffer portion 53 and the chute portion 54. That is, the buffer portion 53 is equipped so as to align supplied electronic components to enable them to feed with constant timing. The pipe 55 has a length to some extent, so that plural electronic component chips supplied to the pipe 55 from the hopper 52 are transferred to the chute portion 54 side at constant spaces in a manner that electronic component chips in front of the pipe are pushed by electronic component chips in the rear during passing through the pipe 55. On the other hand, the chute portion 54 is formed of the top portion of the pipe 55, so that aligned electronic component chips are taken out one at a time from a top opening 55a of the pipe 55.

In the conventional electronic component chip feeder 51, numerous electronic component chips supplied into the hopper 52 at random are fed one at a time to the discharge outlet 52b colliding with one another in the hopper 52 by the applied vibration, as described above. Since the buffer portion 53 is formed of the pipe 55 having a length to some extent, front and rear electronic component chips collide with each other during passing through the pipe 55.

Accordingly, there has been a problem in which by friction between the electrodes formed on the outer surfaces of electronic component chips, the surface of a solder layer or a Sn layer formed on an electrode for promoting solderability is oxidized to be black so that solderability is reduced.

Figure 8:
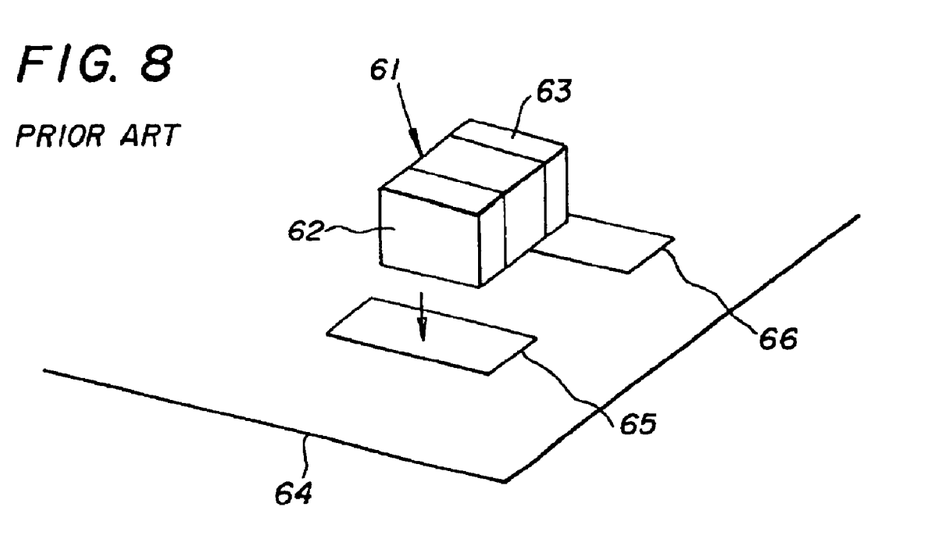
FIG. 8 is a perspective view showing a process of mounting the electronic component chip on a printed circuit board in a conventional practice.

That is, as shown in FIG. 8, an electronic component 61 is soldered to electrodes 65 and 66 on a printed circuit board 64 utilizing the bottom surfaces of outer electrodes 62 and 63 of the electronic component 61. However, since the outer surfaces of the outer electrodes 62 and 63 are oxidized, solderability is prone to be reduced.

Recently, the size of an electronic component chip has been all the more reduced. Accordingly, the area of an electrode formed on the outer surface of an electronic component chip is becoming close to that of dust or shavings produced by collisions of the electronic component chips with one another. Therefore, when dust or shavings stick to the surfaces of electrodes, the reliability of electrical connections is prone to decrease due to reduced solderability.

SUMMARY OF THE INVENTION

It is an object of the present invention to provide an electronic component chip feeder for enabling to feed electronic component chips in which the surface of the electrode thereof is maintain to be clean during feeding electronic component chips, so that the reliability of electrical connections is excellent even when the miniaturizing thereof is promoted, by solving the above-described problem of the conventional electronic component chip feeder.

Another object of the invention is to provide a manufacturing method of electronic devices using electronic component chips being excellent in the reliability of electrical connections.

In accordance with one aspect of the present invention, an electronic component chip feeder for feeding electronic component chips comprises a supplying system for supplying a plurality of electronic component chips in an aligned relationship; and a cleaning device disposed in an intermediate portion of the supplying system for cleaning the outer surfaces of the electronic component chips.

In the invention, the supplying system may comprise a hopper into which a large number of electronic component chips is supplied; a buffer portion connected to the hopper for transferring electronic component chips in an aligned relationship; and a chute portion connected to the rear stage of the buffer portion for feeding electronic component chips one at a time, and wherein the cleaning device may be disposed between the buffer portion and the chute portion.

In the invention, the cleaning device may be provided with a grinding device for grinding outer surfaces of electronic component chips.

In the invention, the grinding device may comprise an abrasive belt and a driving source for driving the abrasive belt.

In the invention, an electronic component chip feeder may further comprise a conveyor belt for conveying electronic component chips, wherein the conveyor belt may serve as well as the abrasive belt.

In the invention, the cleaning device may be provided with a washing device for washing outer surfaces of electronic component chips by a washing liquid.

In accordance with another aspect of the present invention, a method for manufacturing electronic devices using electronic component chips comprises the steps of supplying a plurality of electronic component chips in an aligned relationship; and cleaning outer surfaces of the electronic component chips.

In the invention, the step of supplying a plurality of electronic component chips may comprise the steps of supplying a plurality of electronic component chips by a hopper; transferring a plurality of electronic component chips by a buffer portion; and feeding a plurality of electronic component chips one at a time by a chute portion disposed in the rear stage of the buffer portion, and wherein the step of cleaning outer surfaces of the electronic component chips may be provided between the step of transferring a plurality of electronic component chips by a buffer portion and the step of feeding a plurality of electronic component chips by a chute portion.

In the invention, the step of cleaning outer surfaces of the electronic component chips may comprise a process of grinding outer surfaces of electronic component chips.

In the invention, the process of grinding outer surfaces of electronic component chips may be carried out with an abrasive belt and a driving source for driving the abrasive belt.

In the invention, the step of transferring a plurality of electronic component chips may be provided with a transferring belt for transferring electronic component chips and the transferring belt may serve as well as the abrasive belt.

In the invention, the step of cleaning outer surfaces of the electronic component chips may be performed by washing outer surfaces of electronic component chips using a washing liquid.

DESCRIPTION OF THE PREFERRED EMBODIMENTS

Referring now to the drawings, the present invention will be further specifically described with illustration of unlimited embodiments according to the present invention.

Figure 2:
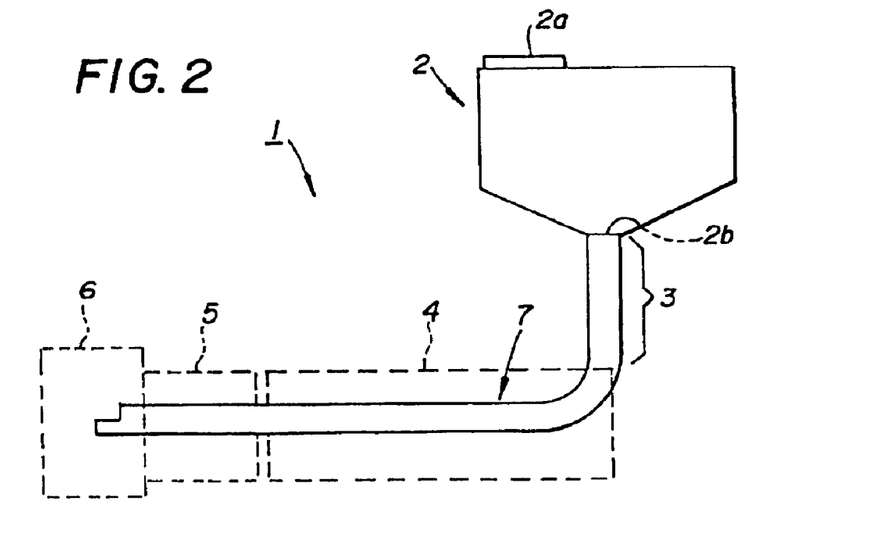
FIG. 2 is a schematic block diagram for illustrating an electronic component chip feeder according to the first embodiment of the present invention.

FIG. 2 is a schematic block diagram for illustrating an electronic component chip feeder according to an embodiment of the present invention.

The electronic component chip feeder 1 comprises a hopper 2, an aligning portion 3 connected to the hopper 2, a buffer portion 4, a cleaning device 5, and a chute portion 6;

The hopper 2 has an electronic component chip supplying inlet 2a disposed on the top portion thereof for supplying numerous electronic component chips therefrom at random. The hopper 2 has a volume capable of accommodating a large number of electronic component chips just as does this type of conventional electronic component chip feeder. In the bottom portion of the hopper 2, a discharge outlet 2b is formed. The discharge outlet 2b has a size and shape enabling one electronic component chip to be discharged.

The hopper 2 is connected to a vibrating source (not shown), so that numerous electronic component chips therein are transferred toward the discharge outlet 2b by applied vibration.

The discharge outlet 2b is connected to a pipe 7. This pipe 7 extends toward the chute portion 6 from the discharge outlet 2b of the hopper 2. The pipe 7 is formed so as to enable one electronic component chip to pass through the pipe 7. In the vicinity of the pipe 7 connected to the discharge outlet 2b, the aligning portion 3 is formed. That is, electronic component chips supplied from the hopper 2 enter the pipe 7 and are aligned in the longitudinal direction of the pipe 7 during passing through the aligning portion 3.

In the pipe 7, the buffer portion 4 is formed in the rear stage of the aligning portion 3. In the buffer portion 4, electronic component chips in the pipe 7 are transferred toward the top of the pipe 7 by transferring means (not shown). The transferring velocity of electronic component chips is selected in accordance with the picking out velocity of electronic component chips from the chute portion 6. As for this transferring, a device for sucking electronic component chips from the top of the pipe 7 or a transferring apparatus such as a transfer belt may be used. Alternatively, the pipe 7 may be inclined downwardly toward the top of the pipe 7 to transfer electronic component chips. In the buffer portion 4, electronic component chips transferred from the aligning portion 3 in an aligned relationship are transferred by being touched by front and rear electronic component chips or at constant spaces according to the adjustment of the above-mentioned transferring velocity. Therefore, electronic component chips can be picked out from the chute portion one by one with constant timing.

In the rear stage of the buffer portion 4, a cleaning device 5, which is a distinctive feature of this embodiment, is formed. The specific structure of the cleaning device 5 will be now described with reference to FIGS. 1A and 1B. The cleaning device 5 comprises a case 8 with an aperture 8a formed on the top portion thereof. A pair of rollers 9 and 10 are arranged inside the case 8. An endless belt 11 is entrained about the rollers 9 and 10.

Figure 1A:
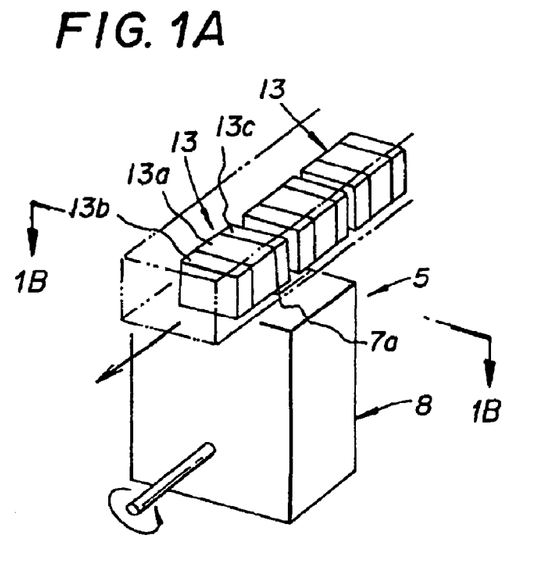
FIG. 1A is a perspective view for illustrating a cleaning device according to an embodiment of the present invention.
Figure 1B:
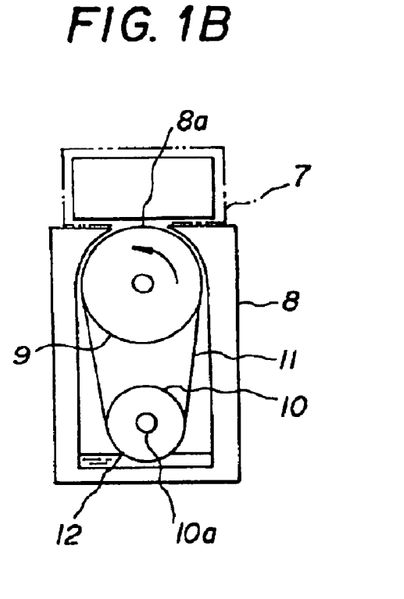
FIG. 1B is a schematic sectional view along the line A—A of FIG. 1A.

The center axis 10a of the roller 10 extends outside of the case 8 and a rotary-driving source (not shown) is connected thereto. Therefore, the center axis 10a and the roller 10 are driven in the direction indicated by the arrow in the drawing by driving the rotary-driving source. Accordingly, the roller 9 connected to the roller 10 through the endless belt 11 is driven in the direction indicated by the arrow in the drawing.

As the rotary-driving source connected to the center axis 10a, a motor utilizing electricity or air may be used, alternatively, a reciprocating driving source may be used, to which a converting mechanism for converting a reciprocating driving force to a rotary-driving force is connected. Furthermore, a driving force for use in a mounter for mounting electronic component chips on a printed board may be utilized.

On the other hand, a washing liquid 12 is stored in the lower part of the roller 10. The endless belt 11 is immersed into the washing liquid 12 while moving around the outer surface of the roller 10.

In the aperture 8a in the upper portion of the case 8, the device is formed so that the outer surface of the endless belt is exposed in the aperture 8a. In this case, the outer surface of the endless belt is exposed so as to protrude slightly from the aperture 8a upwardly. That is, the diameter of the roller 9 and the thickness of the endless belt 11 are selected so that the outer surface of the endless belt is slightly exposed from the aperture 8a upwardly.

On the other hand, in the pipe 7, an aperture 7a is formed in the opposed position to the above-mentioned aperture 8a (FIG. 1A).

As shown in FIG. 1A, inside the pipe 7, plural electronic component chips 13 are transferred in the longitudinal direction of the pipe 7 in an aligned relationship. In the embodiment, monolithic capacitors are used as the electronic component chips 13. In the electronic component chip 13, external electrodes 13b and 13c are formed so as to cover end surfaces opposing each other of a rectangular ceramic sintered body having external electrodes thereon. The external electrodes 13b and 13c are formed so as to cover not only end surfaces but also to extend to top and bottom surfaces and both side surfaces of the ceramic sintered body 13a.

Therefore, when a chip proceeds to the aperture 7a of the pipe 7, the endless belt 11 is touched with a portion of the bottom surface of the ceramic sintered body 13 a to which the external electrode 13b or the external electrode 13c extends (referred to as "the external electrode bottom surface" below). That is, the outer surface of the endless belt 11 slides on the external electrode bottom surface to thereby clean the external electrode bottom surface by the washing liquid stuck to the outer surface of the endless belt 11.

Returning to FIG. 2, electronic component chips are conveyed to the chute portion 6 after being cleaned by the above-mentioned cleaning device 5. In the chute portion 6, the electronic component chips are fed one at a time at a velocity according to a requirement for mounting the electronic component chips on a printed circuit board, etc.

In this embodiment, since the cleaning device 5 is arranged between the buffer portion 4 and the chute portion 6, the external electrode bottom surface is cleaned in the cleaning device 5.

That is, during passing through the hopper 2, the aligning portion 3, and the buffer portion 4, the electronic component chips are collided with one anther so that the surfaces of the external electrodes 13b and 13c are oxidized to be black by friction, or the exterior surfaces of the external electrodes 13b and 13c may be contaminated by adhesion of shavings produced by collisions, or dust, etc.

However, in this embodiment, dust, oily substances, etc. sticking to the bottom surfaces of the external electrodes 13b and 13c are removed in the cleaning device 5. Therefore, when the electronic component chips 13 are mounted on a printed circuit board, they can be securely joined by soldering and so forth utilizing the cleaned external electrode bottom surfaces.

Therefore, according to this embodiment, the reliable supply of electronic component chips being excellent in the reliability of electrical connections to a printed circuit board, etc. can be achieved with high stability.

As the washing liquid 12 is used for cleaning of the bottom surface of the external electrode as described above, an appropriate washing liquid may be used as long as it can clean the external electrodes 13b and 13c. An organic solvent having large volatility such as ethanol, acetone is preferable to be used. That is, when the electronic component chip is finally joined to a printed circuit board, etc. by soldering, using of a highly volatile cleaning agent enables it to improve the reliability of electrical connections all the better because the washing liquid has been dried when it is joined by soldering. In addition, a drying device may be juxtaposed in the rear stage of the cleaning device for drying the washing liquid more securely.

A material for forming the endless belt 11 is also not particularly limited; however it is preferable to use a material having an excellent absorptive property to the washing liquid 12 and moreover ability for increasing an effective contacting area during being in contact with the external electrodes 13b and 13c. As such materials, cloth, paper, felt, etc. in which numerous fibers are entangled with one another can be proposed.

Since the contacting area between the external electrodes 13b and 13c of the electronic component chip 13 and the endless belt 11 is determined by the roller 9, it is preferable to use the roller 9 having a large diameter as much as possible.

Figure 3:
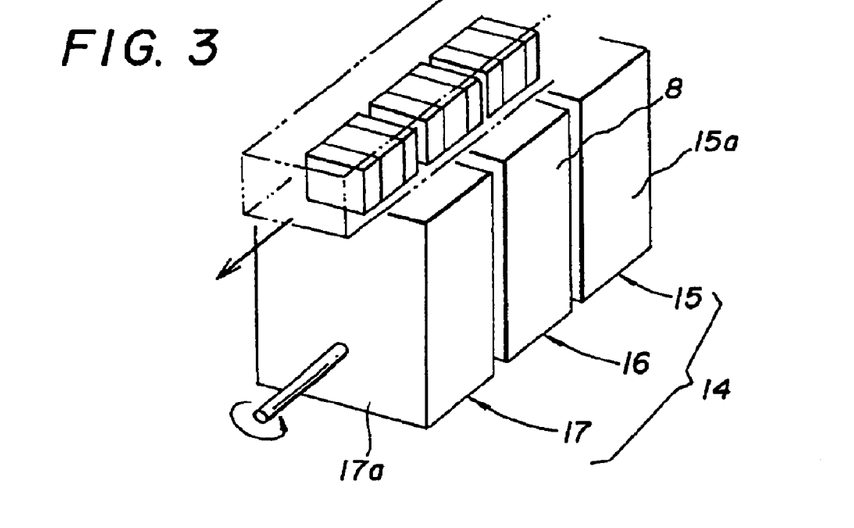
FIG. 3 is a perspective view for illustrating a modified cleaning device in the electronic component chip feeder according to the first embodiment.

As the cleaning device 5 in the first embodiment, the cleaning device 5 applying the washing liquid 12 is described; however, it is not limited to the one using a washing liquid and it may be of a structure in which surfaces of the external electrodes are ground. FIG. 3 is a perspective view showing a cleaning device according to a modified embodiment.

In a cleaning device 14, a grinding portion 15, a washing portion 16, and a flux-coating portion 17 are arranged in the direction from the upstream toward the lower part of the pipe 7. The grinding portion 15 has a case 15a formed identically with the case 8 of the cleaning device 5. However, in the case 15a, the washing liquid 12 is not stored. A pair of rollers and an endless belt are also arranged in the case 15a. However, an abrasive belt is used as the endless belt. That is, the endless belt is used, which can grind surfaces of the external electrodes 13b and 13c when it touches the external electrodes 13b and 13c. As such an abrasive belt, an endless belt with sandpaper laminated on the surface thereof, an endless belt with an abrasive applied on the surface thereof, or the like is used. For example, an abrasive belt may be formed by a method in which alumina powder dispersed in a solvent is stored in the case 15a to immerse the endless belt into the abrasive which is applied to the outer surface of the endless belt.

Above the grinding portion 15, an aperture on the bottom surface of the pipe 7 is also formed at the corresponding portion to that in which the endless belt is exposed. Accordingly, the bottom surfaces of the external electrodes 13b and 13c are ground by the abrasive belt so that oxide coating is removed by grinding when the bottom surfaces of the external electrodes 13b and 13c are oxidized to be black. Likewise, oily substances or dust stuck to the bottom surfaces of the external electrodes 13b and 13c are also removed.

However, when the grinding portion 15 is used, shavings from grinding are produced. Therefore, the washing portion 16 is formed in the rear stage of the grinding portion 15 as shown in FIG. 3. The washing portion 16 is identically formed with the cleaning device 5 shown in FIG. 1. That is, it has the case 8 in which the washing liquid 12 is stored.

Therefore, the bottom surfaces of the external electrodes 13b and 13c of the electronic component chip 13 are washed in the washing portion 16 so that shavings produced by grinding are securely removed therefrom to clean the bottom surfaces of the external electrodes 13b and 13c.

On the other hand, the flux-coating portion 17 is formed in the rear stage of the above-mentioned washing portion 16 in the cleaning device 14 shown in FIG. 3. The flux-coating portion 17 is identically formed with the cleaning device 5 shown in FIG. 1 except for flux stored therein instead of the washing liquid 12. Above the flux-coating portion 17, an aperture on the bottom surface of the pipe 7 is also formed at the corresponding position to that of the aperture in the top of the case 17a. Thereby, flux is coated on the bottom surfaces of the external electrodes 13b and 13c of the electronic component chip 13.

In this modified embodiment, since flux is coated on the bottom surfaces of the external electrodes 13b and 13c in the flux-coating portion 17 just after they are cleaned in the grinding portion 15 and the washing portion 16 as described above, flux can be securely coated on the cleaned bottom surfaces of the external electrodes 13b and 13c, resulting in effectively better improvement of the reliability of joining during soldering.

In addition, the grinding portion 15, the washing portion 16, and the flux-coating portion 17 are arranged in order in this modified embodiment; however, all the portions are not necessarily used. For example, the cleaning device may be formed of only the grinding portion 15 and the washing portion 16, or may be formed of only the grinding portion 15. In particular, when only the oxide-coating layer produced on the surface of the external electrode by friction or collisions is to be removed, only the grinding portion 15 may be used.

Furthermore, the cleaning device may be formed of only the flux-coating portion 17. That is, the above-mentioned oxide-coating layer can be removed and solder wetting property can be improved as well by coating of flux to thereby enable to promote solderability.

Figure 4:
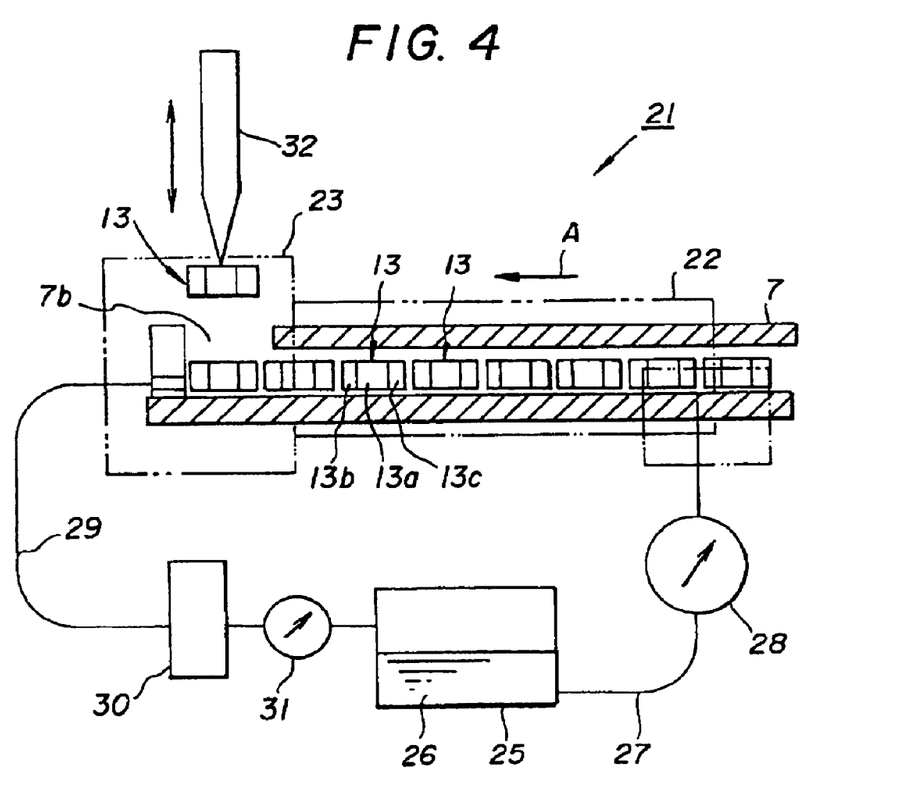
FIG. 4 is a schematic block diagram for illustrating an electronic component chip feeder according to another embodiment of the present invention.

FIG. 4 is a schematic block diagram for illustrating an electronic component chip feeder according to another embodiment of the present invention.

In FIG. 4 of the electronic component chip feeder 21, only a buffer portion 22, a chute portion 23, and the cleaning device are illustrated. That is, the illustration of the hopper portion and the aligning portion in the upstream side is abbreviated.

In the electronic component chip feeder 21, numerous electronic component chips 13 are transferred by air in the pipe 7. That is, via the hopper portion and the aligning portion (not shown), numerous electronic component chips 13 are conveyed by sucking or blowing of air toward the top side of the pipe 7 along the direction indicated by the arrow "A".

In this embodiment, the cleaning device has a washing liquid tank 25 storing a washing liquid for washing the outer surfaces of the external electrodes 13b and 13c. In the washing liquid tank 25, a washing liquid 26 is stored.

A washing liquid supplying line 27 is connected to the washing liquid tank 25. The washing liquid supplying line 27 is connected to the pipe 7 via a pressurizing pump 28. That is, through-holes are formed in the pipe 7 for supplying the washing liquid from the washing liquid supplying line 27, which is connected to the through-holes.

The pressurizing pump 28 is disposed for supplying the washing liquid 26 from the washing liquid supplying line 27 into the pipe 7. As for the above-mentioned pressurizing pump 28, any appropriate pump suitable for supplying medical fluids may be used.

A washing liquid recovery line 29 is connected to the top of the chute portion 23. The washing liquid recovery line 29 is connected to the washing liquid tank 25 via a filtration filter 30 and a suction pump 31. The filtration filter 30 is disposed for removing foreign particles in the recovered washing liquid. As for the filtration filter 30, any appropriate filter such as a filtration filter having a fiber layer with meshes may be used.

The suction pump 31 is disposed for sucking the washing liquid. As for the suction pump 31, any appropriate pump such as a rotary pump or a vane pump may be also used.

On the other hand, in the chute portion 23, the aperture 7b is formed in the upper portion of the pipe 7. This aperture 7b forms an aperture for picking the electronic component chips 13 out. In the chute portion 23, a sucking chuck 32 is lowered from the position over the aperture 7b to pick the electronic component chips 13 out.

In the electronic component chip feeder 21 in this embodiment, as described above, the washing liquid 26 is supplied from the cleaning device to the portions where the buffer portion 22 and the chute portion 23 are disposed so that the washing liquid 26 flushes from the buffer portion 22 toward the chute portion 23. Accordingly, the outer surfaces of the external electrodes 13b and 13c are cleaned during transportation of the electronic component chips 13 transferred by air.

The cleaning device is not necessarily disposed between the buffer portion 22 and the chute portion 23 in this manner; the washing liquid from the cleaning device may be supplied to the overall region where the buffer portion 22 and the chute portion 23 are disposed.

In addition, a plurality of the above-mentioned washing liquid supplying lines 27 and washing liquid recovery lines 29 may be formed so as to be connected to plural electronic component chip feeding systems comprised of the pipes 7, the buffer portions 22, and the chute portions 23. That is, for the plural electronic component chip feeders, the washing liquid tank 26, the pressurized pump 28, the filtrate filter 30, and the suction pump 31 may be used jointly together.

Figure 5:
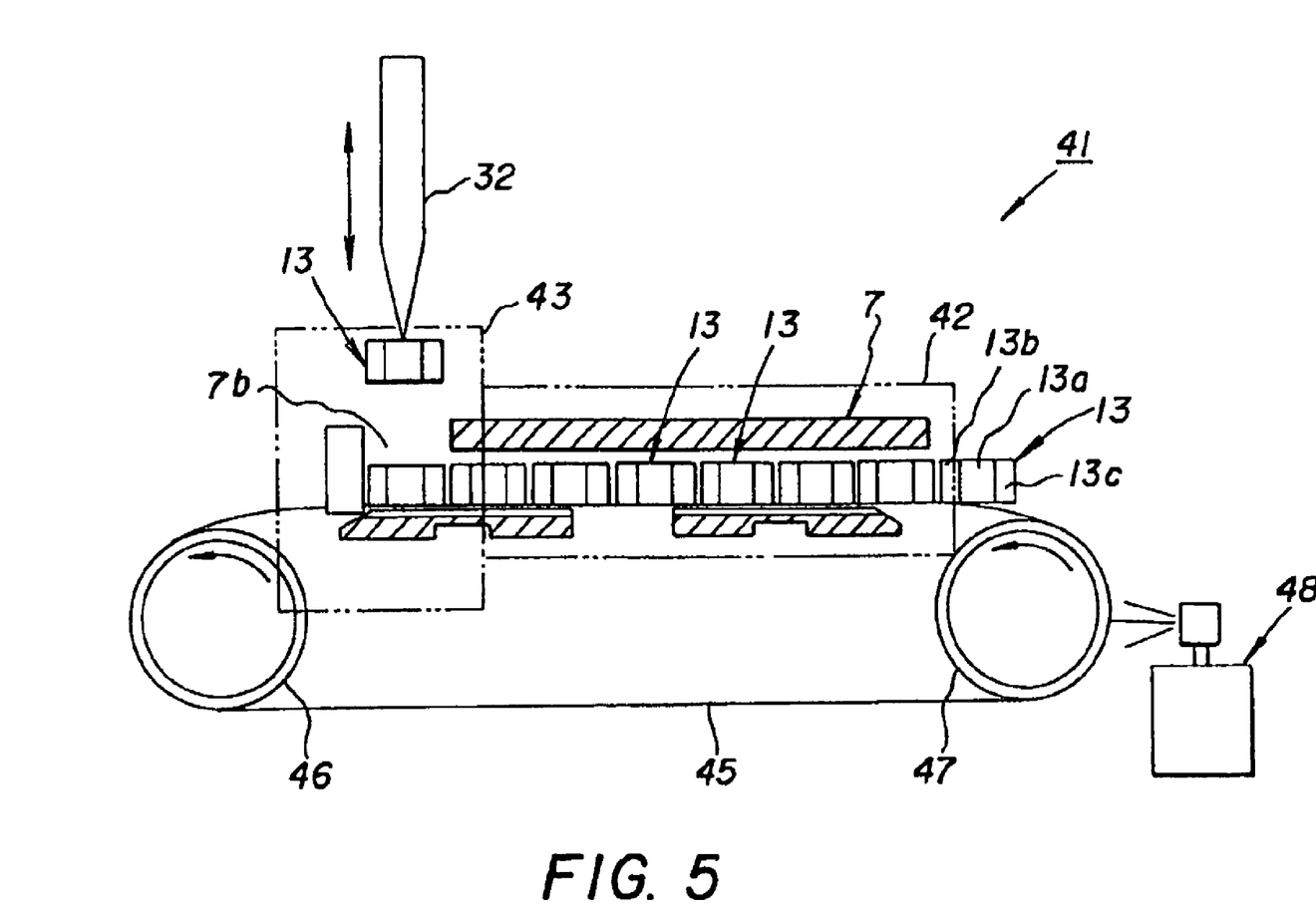
FIG. 5 is a schematic block diagram showing an electronic component chip feeder according to still another embodiment of the present invention.

FIG. 5 is a schematic block diagram for illustrating an electronic component chip feeder according to still another embodiment of the present invention.

In FIG. 5, just like in the second embodiment, the illustration of the hopper portion and the aligning portion of the electronic component chip feeder is abbreviated. The electronic component chip feeder 41 is formed of a buffer portion 42, a chute portion 43, and a cleaning device. In the feeder, plural electronic component chips 13 are transferred in an aligned relationship from the buffer portion 42 toward the chute portion 43.

However, as for the transferring, a conveyor belt 45 is used. That is, the conveyor belt 45 is entrained about a pair of rollers 46 and 47. At least one of the rollers 46 and 47 is driven in the direction indicated by the arrow by a rotary-driving source such as a motor and so forth. Therefore, the rollers 46 and 47 are rotated in the direction indicated by the arrow to move the conveyor belt 45, so that the electronic component chips 13 are transferred from the buffer portion 42 toward the chute portion 43.

On the other hand, a washing liquid coating device 48 is arranged in the region where the upstream side roller 47 is disposed. A washing liquid being identical to that used in the first embodiment is sprayed on the outer surface of the conveyor belt 45 by the washing liquid coating device 48.

Therefore, during conveying of the electronic component chips 13 by the conveyor belt 45, the bottom surfaces of the external electrodes 13*b* and 13*c* are washed by the washing liquid applied to the outer surface of the conveyor belt 45.

Since the configuration of the chute portion 43 is the same as that in the second embodiment, like reference characters designate like functional portions.

In the third embodiment, as described above, the conveyor belt 45 which is conveying means for conveying the electronic component chips 13 also functions as a cleaning device by spraying the washing liquid to the conveyor belt 45.

In this case, when the outer surface of the conveyor belt 45 is preferably formed being identical with the abrasive belt used in the modified first embodiment, not only the cleaning function but also the grinding function can be achieved. That is, the conveyor belt 45 may be an abrasive belt in which the outer surface thereof has the grinding function, or not merely the above-mentioned washing liquid is sprayed on the conveyor belt 45 but also the conveyor belt 45 may be immersed into the abrasive to form the abrasive belt.

In addition, FIG. 5 shows a structure of the washing liquid coating device in which the washing liquid is sprayed on the outer surface of the conveyor belt 45; however a portion of the conveyor belt 45 may be immersed into the washing liquid so as to apply the washing liquid on the outer surface of the conveyor belt 45; the method for applying the washing liquid on the outer surface of the conveyor belt 45 is arbitrary.

In FIG. 5, the washing liquid is applied on the outer surface of the conveyor belt 45; however when the conveyor belt 45 is to be an abrasive belt as described above, the washing liquid is not necessarily used.

In the electronic component chip feeder 41 according to the present invention, the electronic component chips 13 are intermittently picked out by the sucking chuck 32 in the chute portion 43. Therefore, it is necessary to move the electronic component chip 13 by at least the length of one electronic component chip per one action of the sucking chuck 32 in the buffer portion 42 and the chute portion 43. In addition, the term "the length of the electronic component chip" designates the size thereof in the transferring direction.

However, in this embodiment, the conveyor belt 45 is formed to move by the length of two to four electronic component chips per one action of the sucking chuck 32.

That is, the electronic component chips 13 are laid on the conveyor belt 45, which is intermittently driven, so as to be conveyed. In this case, it is intended that the electronic component chip 13 is moved by the length of one chip even when the conveyor belt 45 moves by the length of two to four electronic component chips owing to the slippage produced between the outer surface of the conveyor belt 45 and the electronic component ship 13.

Accordingly, the bottom surfaces of the external electrodes 13*b* and 13*c* are rubbed by the conveyor belt 45 due to the displacement difference between the electronic component chip 13 and the conveyor belt 45, such that the bottom surfaces of the external electrodes 13*b* and 13*c* are cleaned.

Figure 6:
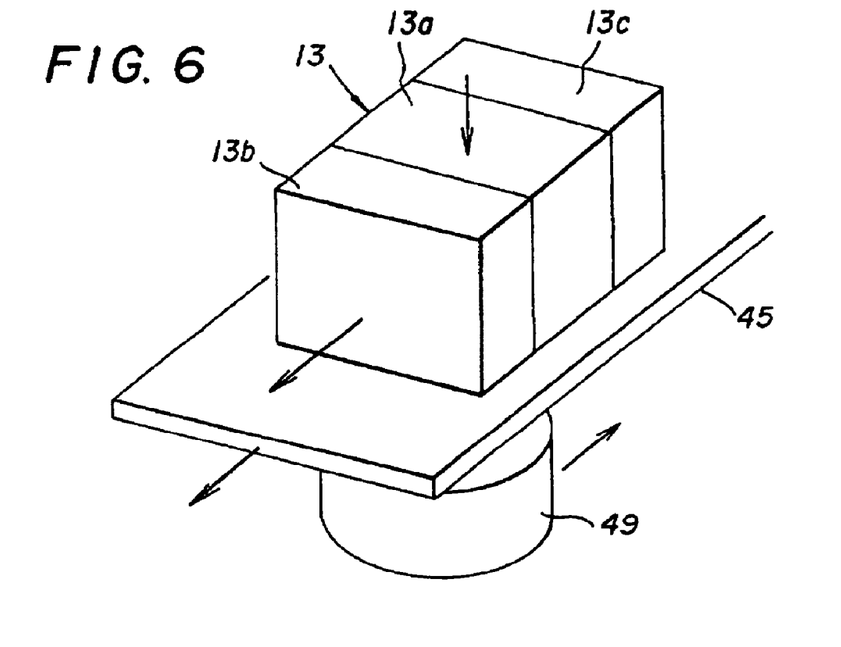
FIG. 6 is a perspective view for illustrating a modified electronic component chip feeder according to the third embodiment in which a friction force between the conveyor belt and the electronic component chip is increased by using a magnet.

Preferably, in order to increase the friction between the bottom surfaces of the external electrodes 13*b* and 13*c* of the electronic component chip 13 and the conveyor belt 45 during sliding movement, a magnet 49 may be arranged at the bottom surface of the conveyor belt 45 as shown in FIG. 6. That is, when the electronic component chips 13 or the external electrodes 13*b* and 13*c* include a magnetic material such as iron or nickel, which is attracted by a magnet, the magnet 49 is arranged beneath the conveyor belt 45. Therefore, the external electrodes 13*b* and 13*c* are firmly pressed against the conveyor belt 45 to thereby increase a friction force between the external electrodes 13*b* and 13*c* and the conveyor belt 45, resulting in more effective exertion of the cleaning function.

More preferably, when the magnet 49 is moved in the reverse direction to the conveyor belt 45, it is easy to decrease the movement of the electronic component chip 13 in the transferring direction relative to the movement of the conveyor belt 45 as described above. Thereby, cleaning of the bottom surfaces of the external electrodes 13*b* and 13*c* can be more effectively achieved by friction between the bottom surfaces of the external electrodes and the conveyor belt 45.

In an electronic component chip feeder according to the invention, a cleaning device is disposed in an intermediate portion of the supplying outlet. Thereby, the outer surfaces of the electronic component chips are cleaned, so that electrodes disposed thereon are maintained clean. Therefore, after the electronic component chip is joined to a printed circuit board and so forth by soldering, for example, the reliability of electrical connections can be improved.

In particular, when miniaturization of electronic component chips is promoted, since dust or dirt is relatively increased to the area of electrodes formed on the outer surfaces, the reliability of electrical connections is prone to be deteriorated due to sticking of dust or dirt to the surfaces of electrodes. However, in accordance with the present invention, since electrodes on the outer surfaces of electronic component chips fed by the apparatus are securely cleaned, even when miniaturization of electronic component chips is promoted, effect from such dust or dirt can be securely reduced so as to improve the reliability of electrical connections effectively.

In the invention, since the supplying system may comprise a hopper, a buffer portion, and a chute portion, and the cleaning device may be disposed between the buffer portion and the chute portion, the outer surfaces of electronic component chips are cleaned just before the electronic component chips are fed from the chute portion.

That is, during supplying and aligning of electronic component chips in the hopper portion and the buffer portion, even when oxide coatings are formed on the surfaces of electrodes by friction or dust stick thereto due to collisions of electronic component chips with each other, the surfaces of electrodes are securely cleaned in the cleaning device disposed just before the chute portion.

In the invention, since the cleaning device may be provided with a grinding device for grinding the outer surfaces of electronic component chips, even when the surfaces of electrodes are to be black and oxide coatings are formed thereon by friction, such oxide coatings are securely removed by grinding to clean the surfaces of electrodes.

In the invention, since the grinding device may comprise an abrasive belt and a driving source for driving the abrasive belt, the abrasive belt is brought in contact with the outer surfaces of electronic component chips so that the outer surfaces of electronic component chips, the surfaces of electrodes in particular, are ground by the abrasive belt owing to the driving of the abrasive belt by the driving source to be securely cleaned.

In the invention, an electronic component chip feeder may further comprise a conveyor belt for conveying the electronic component chips, and the conveyor belt may serve as well as the abrasive belt. Therefore, since the conveyor belt for conveying the electronic component chips functions as well as grinding, the outer surfaces of electronic component chips can be cleaned without increasing in complexity of the apparatus.

In the invention, since the cleaning device may be provided with a washing device for washing the outer surfaces of electronic component chips by a washing liquid, not only oxide coatings but also dust, oily substances, etc. can be securely removed.

In the invention of a method for manufacturing electronic devices, since outer surfaces of electronic component chips are cleaned, electronic devices can be manufactured by using electronic component chips being excellent in the reliability of electrical connections.

What is claimed is:

1. A method for manufacturing electronic devices obtained by equipping a printed circuit board with electronic component chips, comprising the steps of:

supplying a plurality of electronic component chips in an aligned relationship; and cleaning outer surfaces of the electronic component chips;

wherein said step of supplying a plurality of electronic component chips comprises the steps of:

supplying a plurality of electronic component chips by a hopper;

transferring a plurality of electronic component chips by a buffer portion; and feeding a plurality of electronic component chips one at a time by a chute portion disposed in the rear stage of the buffer portion, and wherein said step of cleaning outer surfaces of the electronic component chips is provided between said step of transferring a plurality of electronic component chips by a buffer portion and said step of feeding a plurality of electronic component chips by a chute portion.

2. A method according to claim 1, wherein said step of cleaning outer surfaces of the electronic component chips comprises a process of grinding outer surfaces of electronic component chips.

3. A method according to claim 2, wherein the process of grinding outer surfaces of electronic component chips is carried out with an abrasive belt and a driving source for driving the abrasive belt.

4. A method to according claim 3, wherein said step of transferring a plurality of electronic component chips is provided with a transferring belt for transferring electronic component chips and the transferring belt serves as well as the abrasive belt.

5. A method according to claim 4, wherein said step of cleaning outer surfaces of the electronic component chips is performed by washing outer surfaces of electronic component chips using a washing liquid.

6. A method according to claim 2, wherein said step of cleaning outer surfaces of the electronic component chips is performed by washing outer surfaces of electronic component chips using a washing liquid.

7. A method according to claim 3, wherein said step of cleaning outer surfaces of the electronic component chips is performed by washing outer surfaces of electronic component chips using a washing liquid.

8. A method according to claim 1, wherein said step of cleaning outer surfaces of the electronic component chips is performed by washing outer surfaces of electronic component chips using a washing liquid.

9. A method according to claim 1, wherein said step of cleaning outer surfaces of the electronic component chips comprises a process of grinding outer surfaces of electronic component chips.

10. A method according to claim 1, wherein said step of cleaning outer surfaces of the electronic component chips is performed by washing outer surfaces of electronic component chips using a washing liquid.

* * * * *